United States Patent
Huang et al.

[11] Patent Number: 6,033,963
[45] Date of Patent: Mar. 7, 2000

[54] METHOD OF FORMING A METAL GATE FOR CMOS DEVICES USING A REPLACEMENT GATE PROCESS

[75] Inventors: Jenn Ming Huang, Hsin-chu; Chi-Wen Su, North of Hsin-chu; Chung-Cheng Wu, I-Lan; Shui-Hung Chen, Hsin-chu, all of Taiwan

[73] Assignee: Taiwan Semiconductor Manufacturing Company, Hsin-Chu, Taiwan

[21] Appl. No.: 09/385,523

[22] Filed: Aug. 30, 1999

[51] Int. Cl.$^7$ .................................................. H01L 21/336
[52] U.S. Cl. .......................... 438/303; 438/306; 438/683; 438/685; 257/368; 257/408
[58] Field of Search .................................... 438/197, 299, 438/301, 303, 306, 307, 682, 683, 685; 257/368, 408

[56] References Cited

U.S. PATENT DOCUMENTS

| | | | |
|---|---|---|---|
| 4,745,082 | 5/1988 | Kwok | 437/39 |
| 4,963,501 | 10/1990 | Ryan et al. | 437/40 |
| 5,447,874 | 9/1995 | Grivna et al. | 437/40 |
| 5,670,401 | 9/1997 | Tseng | 437/44 |
| 5,960,270 | 9/1999 | Misra et al. | 438/197 |
| 5,966,597 | 10/1999 | Wright | 438/197 |

Primary Examiner—Wael Fahmy
Assistant Examiner—Long Pham
Attorney, Agent, or Firm—George O. Saile; Stephen B. Ackerman; William J. Stoffel

[57] ABSTRACT

A method of forming a metal gate for a CMOS device using a replacement gate process wherein sidewall spacers are formed on a dummy electrode prior to forming the metal gate allowing source and drain formation prior to metal gate formation and a tungsten layer is selectively deposited to act as an each or CMP stop and to reduce source and drain resistance. The process begins by forming a dummy gate oxide layer and a polysilicon dummy gate electrode layer on a substrate structure and patterning them to form a dummy gate. Lightly doped source and drain regions are formed by ion implantation using the dummy gate as an implant mask. Spacers are formed on the sidewalls of the dummy gate. Source and drain regions are formed by implanting ions using, the dummy gate and spacers as an implant mask and performing a rapid thermal anneal. A tungsten layer is selectively deposited on the dummy gate electrode and the source and drain regions. A blanket dielectric layer is formed over the dummy gate and the substrate structure. The blanket dielectric layer is planarized using a chemical mechanical polishing process stopping on the tungsten layer. The tungsten layer overlying the dummy gate and the dummy gate are removed, thereby forming a gate opening. A gate oxide layer and a metal gate electrode layer are formed in the gate opening. The gate electrode layer is planarized to form a metal gate, stopping on the blanket dielectric layer. Alternatively, the dummy gate electrode can be composed of silicon nitride and the selectively deposited tungsten layer can be omitted.

18 Claims, 8 Drawing Sheets

METHOD OF FORMING A METAL GATE FOR CMOS DEVICES USING A REPLACEMENT GATE PROCESS

BACKGROUND OF INVENTION

1) Field of the Invention

This invention relates generally to fabrication of a semiconductor device and more particularly to a method of forming a metal gate for a CMOS device using a replacement gate process wherein sidewall spacers are formed on a dummy electrode prior to forming the metal gate. In one embodiment a selective tungsten layer acts as an etch or CMP stop.

2) Description of the Prior Art

Polysilicon gate electrodes are commonly used in CMOS devices. However, as device densities continue to increase beyond the 0.2 μm generation, polysilicon gates are adversely affected by poly depletion which can reduce performance by more than 15%. When a MOSFET is operated in an inversion mode, part of the gate applied voltage is dropped in the polysilicon due to the poor conductivity of the polysilicon. Because metal is a good conductor, metal gates do not suffer from poly depletion. While metal gates are an attractive alternative they are susceptible to metal migration during subsequent operations that are performed at elevated temperatures.

Another problem with high density (small dimension) devices is precise control of gate lengths. As devices continue to get smaller, precise control of gate lengths becomes critical to assure performance. One method for controlling gate lengths is by using a dummy or replacement gate process. In a replacement gate process, a dummy gate is formed of silicon dioxide or a polymer such as photoresist. An oxide layer is formed over the dummy gate. The dummy gate is removed leasing a gate opening, and the desired gate material is deposited into the gate opening. One problem with existing replacement gate processes is the limited ability to control the height of the dummy gate during removal of the overlying dielectric layer. Also, the etching process to form contact openings can cause oxidation of the source and drain regions leading to higher source and drain resistances.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,447,874 (Grivna et al.) shows a method for forming a dual metal gate using a damascene/CMP process. This method incorporates a large number of processing steps.

U.S. Pat. No. 4,745,082 (Kwok) shows a method for forming a metal gate by metal deposition and CMP back. In this method, additional processing steps are used and the spacers are removed.

U.S. Pat. No. 5,670,401 (Tseng) discloses a poly gate formed by a CMP process.

U.S. Pat. No. 4,963,501 (Ryan et al.) shows various metal gate processes.

SUMMARY OF THE INVENTION

It is an object of the present invention to provide a method for forming a metal gate using a replacement gate process.

It is another object of the present invention to provide a method for forming a metal gate using a replacement gate process with a selective tungsten deposition step.

It is another object of the present invention to provide a method for forming a metal gate with a minimum source and drain resistance.

It is yet another object of the present invention to provide a method for forming a metal gate using a replacement gate process wherein the inter level dielectric (or blanket dielectric layer) is removed using a chemical mechanical polishing process which can be easily stopped on a tungsten layer selectively deposited on the replacement gate electrode.

To accomplish the above objectives, the present invention provides a method of forming a metal gate for a CMOS device using a replacement gate process wherein sidewall spacers are formed on a dummy electrode prior to forming the metal gate allowing source and drain formation prior to metal gate formation. In one embodiment a tungsten layer is selectively deposited to act as an etch or CMP stop and to reduce source and drain resistance. The process begins by forming a dummy gate oxide layer and a polysilicon dummy gate electrode layer on a substrate structure and patterning them to form a dummy gate. Lightly doped source and drain regions are formed by ion implantation using the dummy gate as an implant mask. Spacers are formed on the sidewalls of the dummy gate. Source and drain regions are formed by implanting ions using the dummy gate and spacers as an implant mask and performing a rapid thermal anneal. A tungsten layer is selectively deposited or the dummy gate electrode and the source and drain regions. A blanket dielectric layer is formed over the dummy gate and the substrate structure. The blanket dielectric layer is planarized using a chemical mechanical polishing process stopping on the tungsten layer. The tungsten layer overlying the dummy gate and the dummy gate are removed, thereby forming a gate opening. A gate oxide layer and a metal gate electrode layer are formed in the gate opening. The gate electrode layer is planarized to form a metal gate, stopping on the blanket dielectric layer.

The present invention provides considerable improvement over the prior art. source and drain regions are formed prior to forming the metal gate, eliminating the need for high temperature processing after metal gate formation which could cause metal migration. The height of the dummy gate and therefore the height of the gate electrode can be acurately controlled due to the presence of the tungsten layer over the dummy gate electrode. Also, the selectively deposited tungsten on the source and drain regions can reduce source and drain resistance by preventing oxidation of the underlying silicon.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming a metal gate using a replacement gate process wherein sidewall spacers are formed on a dummy gate electrode prior to forming a metal gate, allowing source and drain formation prior to metal gate formation, thereby preventing metal gate exposure to high temperature source and drain processing. In one embodiment, a selective tungsten deposition is performed to provide an easy chemical mechanical polishing stop and reduced source and drain resistance.

First Embodiment—FIGS. 1–13

Figure 1:
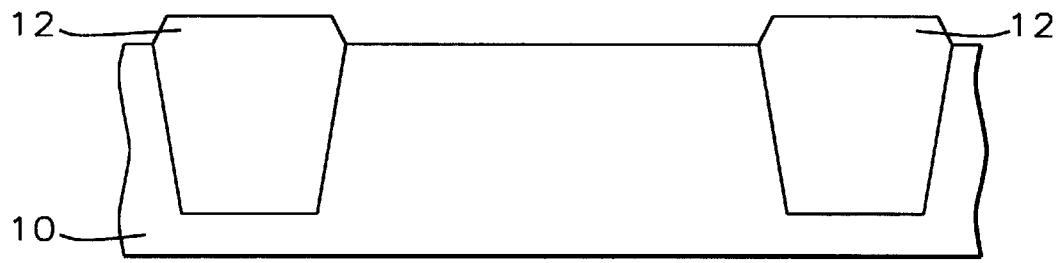
FIGS. 1 through 13 illustrate sequential sectional views of a process for forming a metal gate using a replacement gate process with a selective tungsten deposition according to the invention.

Referring to FIG. 1, the process begins by providing a substrate structure (10) having isolation structures (12) thereon. The substrate structure (10) is preferably a monocrystalline wafer as is known in the art. Isolation structures (12) are formed to electrically isolate various active regions of the substrate from each other are preferably shallow trench isolations.

Figure 2:
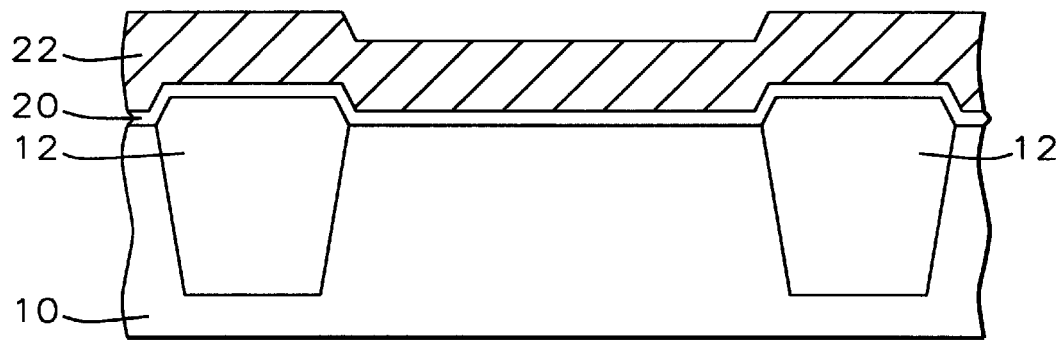

Referring to FIG. 2, a dummy gate oxide layer (20) is formed on the substrate structure (10). The dummy gate oxide layer (20) can be formed by chemical vapor deposition or more preferably can be thermally grown. The dummy gate oxide layer (20) is preferably formed to a thickness of between about 20 Angstroms and 300 Angstroms.

Still referring to FIG. 2, a dummy gate electrode layer (22) is formed on the dummy gate oxide layer (20). The dummy gate electrode layer (22) is composed of polysilicon having a thickness of between about 1000 Angstroms and 3000 Angstroms.

Figure 3:
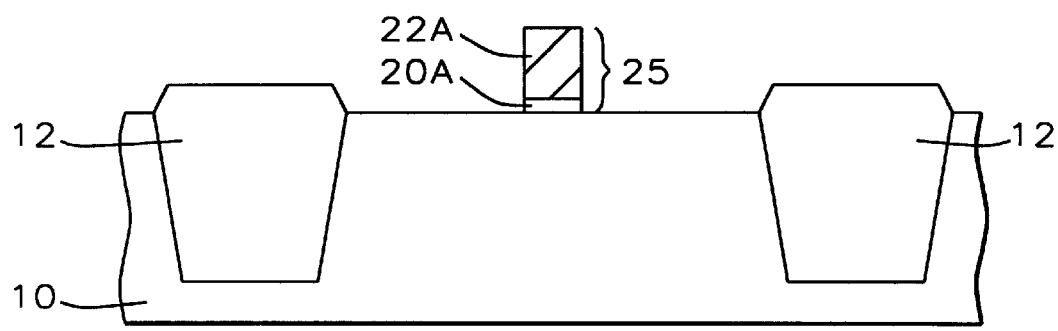

Referring to FIG. 3, the dummy gate electrode layer (22) and the dummy gate oxide layer (20) are patterned using photolithography and anisotropically etching to form a dummy gate (25) comprising a dummy gate oxide (20A) and a dummy gate electrode (22A) and having sidewalls.

Figure 4:
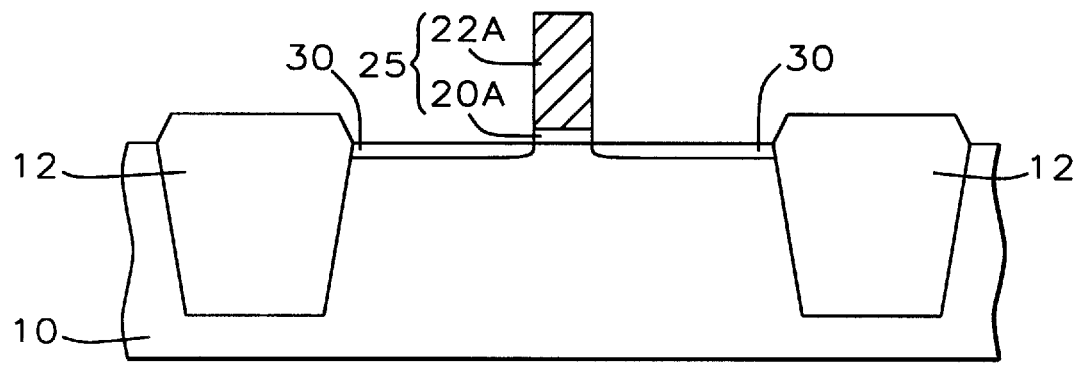

Referring to FIG. 4, impurity ions are implanted into the substrate structure (10) to form lightly doped source and drain regions or highly doped source and drain extensions (30) using the dummy gate (25) as an implant masks. For an N type device the implanted ions can be As or P, most preferably As. As ions can be implanted at an energy of between about 1 KeV and 100 KeV and at a dose of between about 1E12 atm/cm$^2$ and 5E15 atm/cm$^2$.

Figure 5:
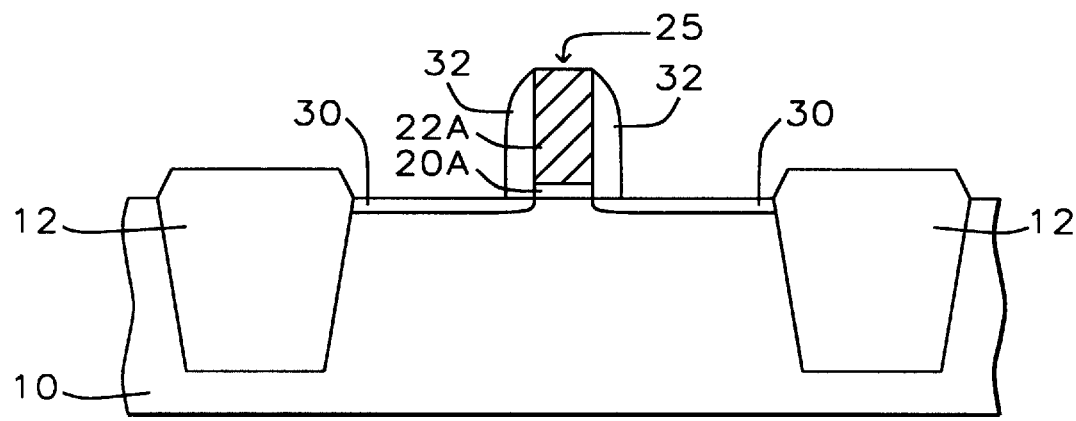

Referring to FIG. 5, spacers (32) are formed on the sidewalls of the dummy gate (25). The spacers (32) are preferably composed of silicon dioxide ($SiO_2$), silicon oxynitride ($Si_xO_yN_z$), composite ($SiO_2/Si_3N_4$), or most preferably silicon nitride ($Si_3N_4$). They can be formed by a blanket deposition and isotropic etch back. The spacers (32) preferably have a thickness of between about 300 Angstroms and 2000 Angstroms.

Figure 6:
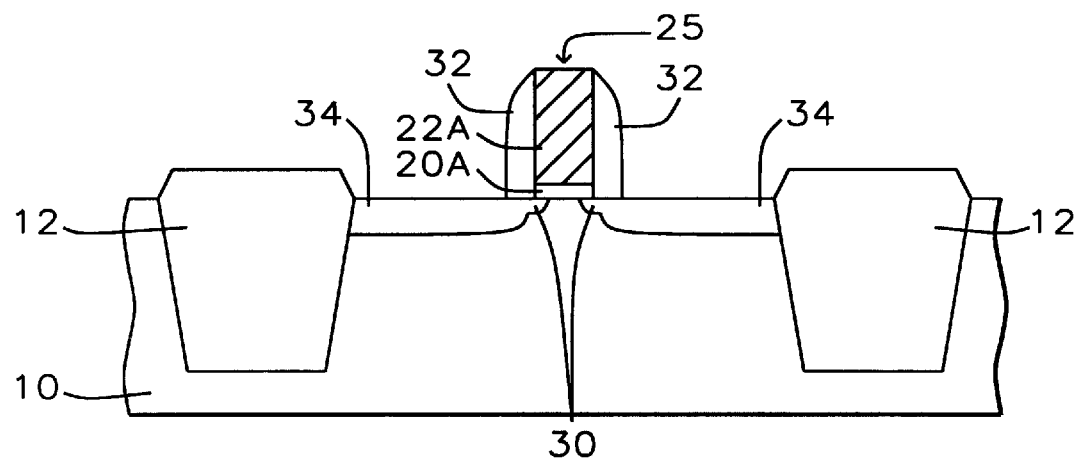

Referring to FIG. 6, impurity ions are implanted into the substrate structure (10) to form source and drain regions (34) using the dummy gate (25) and the spacers (32) as an implant mask. For an N-type device the implanted ions can be As or P, most preferably As. As ions can be implanted at an energy of between about 1 KeV and 100 KeV and at a dose of between about 1E15 atm/cm$^2$ and 8E15 atm/cm$^2$.

In a key step, thermal drive in of the impurity ions is performed at a temperature of between about 950° C. to 1100° C. and time of less than about 120 seconds, to form source and drain regions (34) prior to tungsten deposition.

Figure 7:
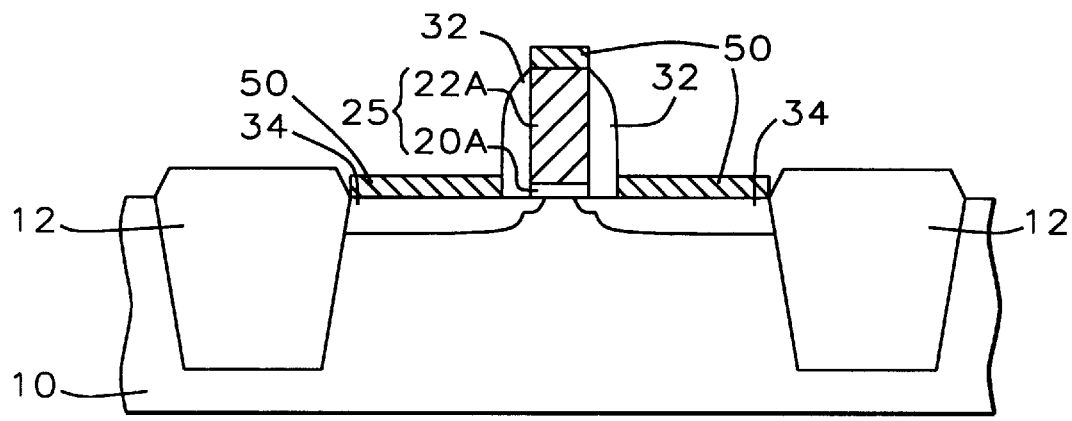

Referring to FIG. 7, a selective tungsten layer (50) is formed on the dummy gate electrode (22A) and on the source and drain regions (34). The tungsten layer can be selectively formed on the polysilicon dummy gate electrode (24A) and the silicon source and drain regions (34) using a chemical vapor deposition process at a temperature of between about 300° C. and 500° C. and a pressure of between about 50 mTorr and 500 mTorr, with source gasses of $SiH_4$ and $WF_6$. The flow rate ratio of the $SiH_4$ to $WF_6$ is between 0.1 and 5.

Figure 8:
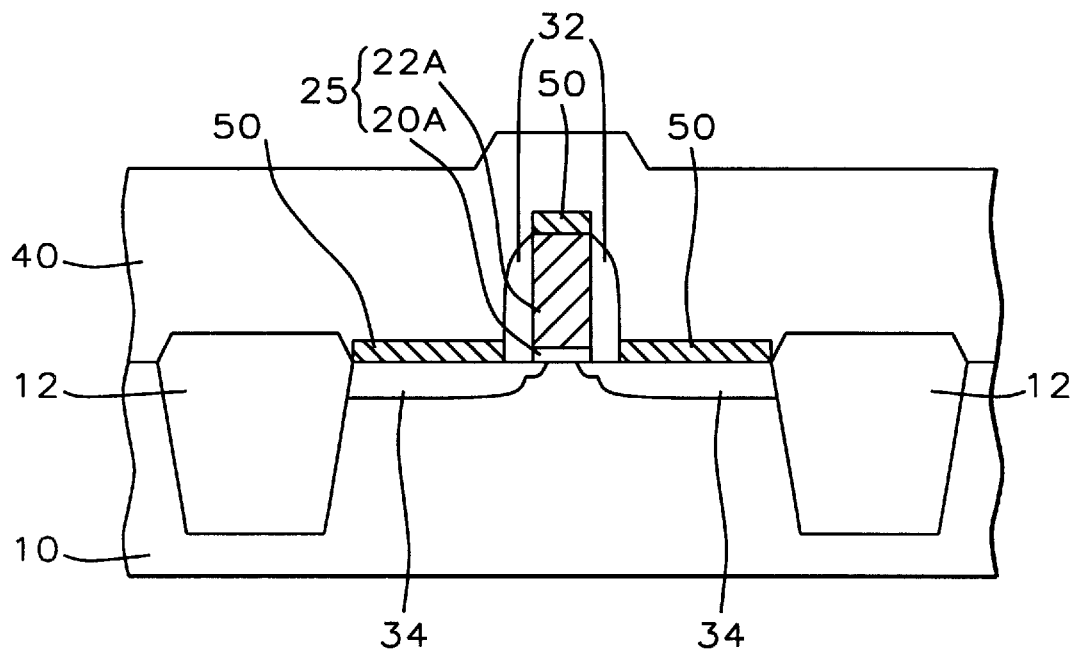

Referring to FIG. 8, a blanket dielectric layer (40) is formed over the dummy gate (25) and the substrate structure (10). The blanket dielectric layer (40) is preferably composed of silicon dioxide having a thickness sufficient so that its top surface is higher at every point than the top surface of the tungsten layer (50).

Figure 9:
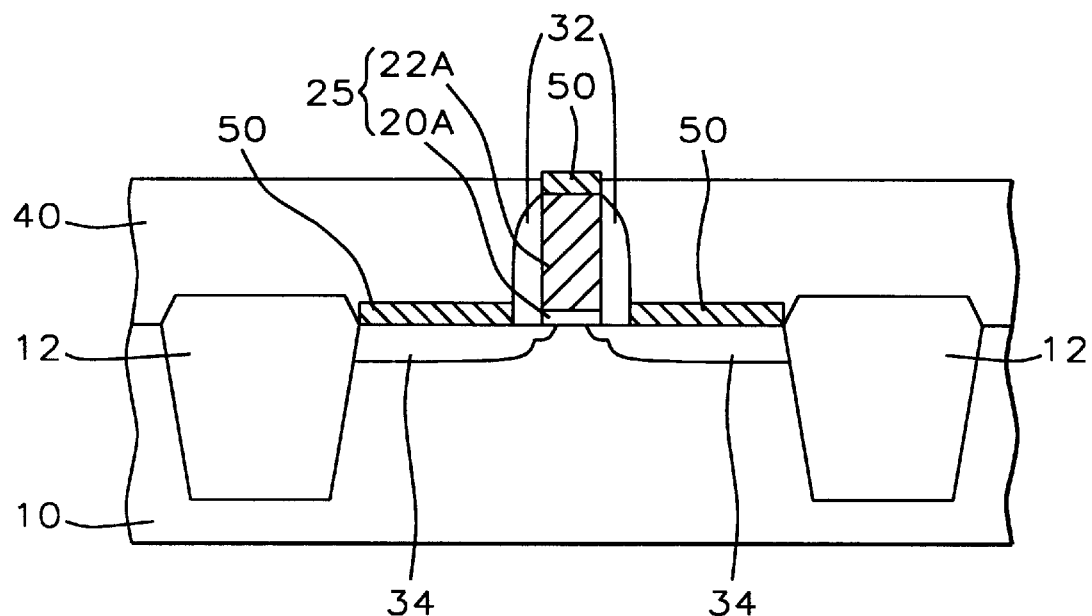

Referring to FIG. 9, the blanket dielectric layer (40) is planarized using a chemical mechanical polishing process and stopping on the tungsten layer (50) over the dummy gate (25). A key advantage of the present invention is that chemical mechanical polishing process provides good selectivity of the dielectric layer (40) to the tungsten layer (50).

Figure 10:
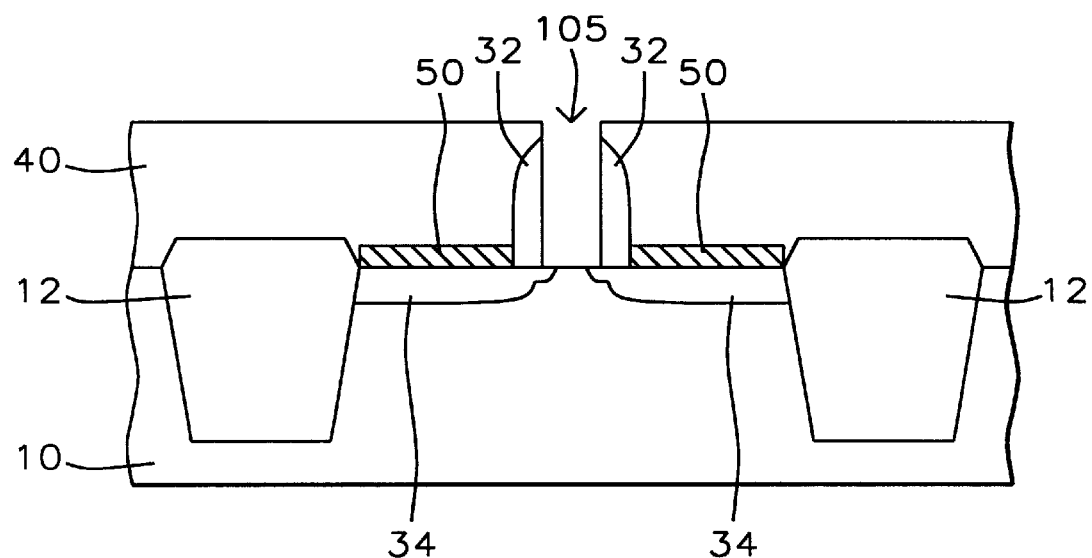

Referring to FIG. 10, the tungsten layer (50), the dummy gate electrode (22A) and the dummy gate oxide (20A) are removed forming a gate opening (105). The tungsten layer (50) over the dummy gate (25) and the dummy gate electrode (22A) are preferably removed using a selective etch such as a plasma etch using chlorine as a reactant to etch the tungsten of the tungsten layer (50) and the polysilicon of the dummy gate electrode (22A) selectively to the silicon dioxide of the blanket dielectric layer (40). The dummy gate oxide (20A) can be removed in-situ using a $CHF_3/CF_4$ etch chemistry, thereby exposing the substrate structure (10) in the gate opening (105).

Figure 11:
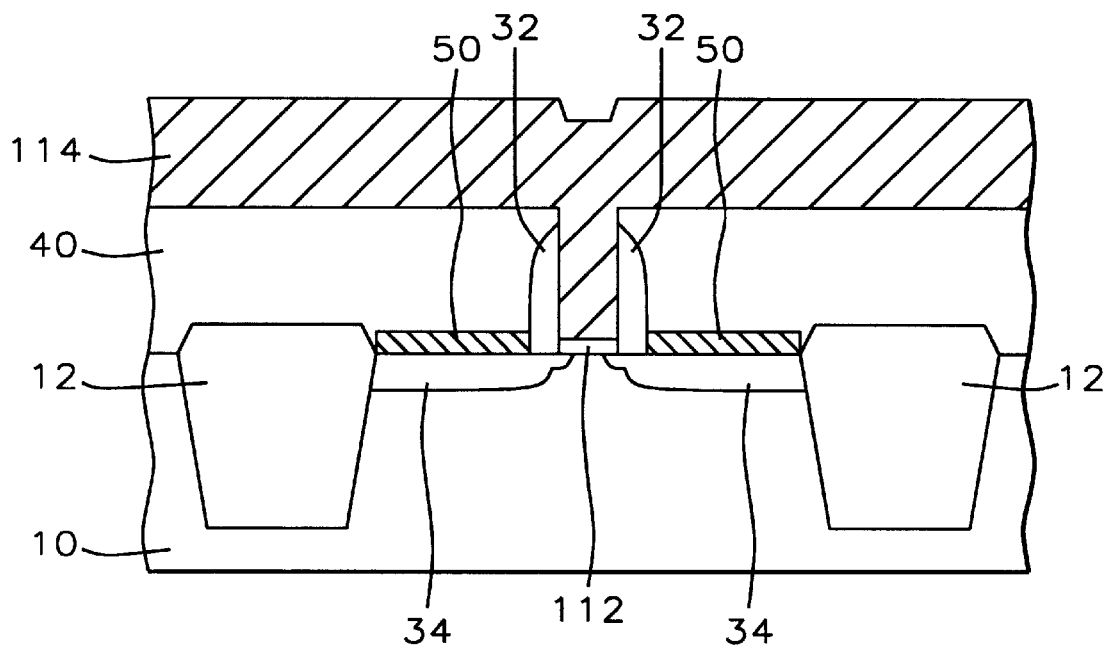

Referring to FIG. 11, a gate oxide layer (112) is formed on the substrate structure (10) in the gate opening (105). The gate oxide layer (112) is preferably formed to a thickness of between about 15 Angstroms and 200 Angstroms using thermal oxidation at a temperature of between about 650° C. and 1000° C. for a time of between about 5 seconds and 3600 seconds.

Still referring to FIG. 11, a gate electrode layer (114) is formed over the gate oxide layer (112), having a sufficient thickness to fill the gate opening. The gate electrode layer (114) is composed of a metal selected from the group comprising titanium, tungsten, or aluminum. The gate electrode layer (114) can be formed using plasma enhanced chemical vapor deposition, sputtering or most preferably chemical vapor deposition. The gate electrode can further comprise a barrier layer of titanium nitride underlying the titanium, tungsten, or aluminum.

Figure 12:
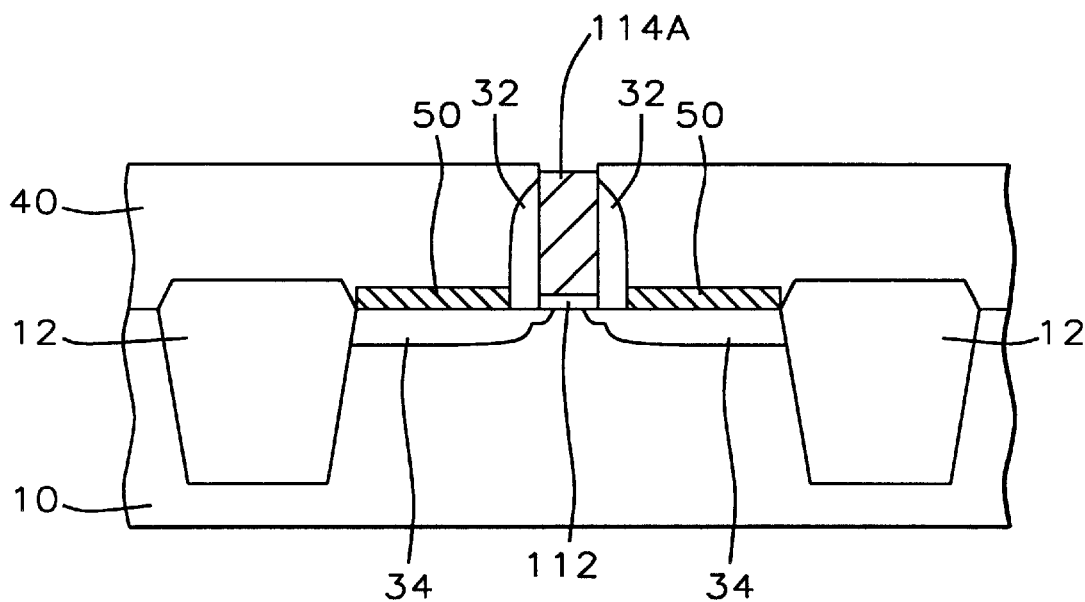

Referring to FIG. 12, the gate electrode layer (114) is planarized, stopping on the blanket dielectric layer (40) thereby forming a gate electrode (114A). The gate electrode layer (114) can be planarized using chemical mechanical polishing or by a metal etch back.

Figure 13:
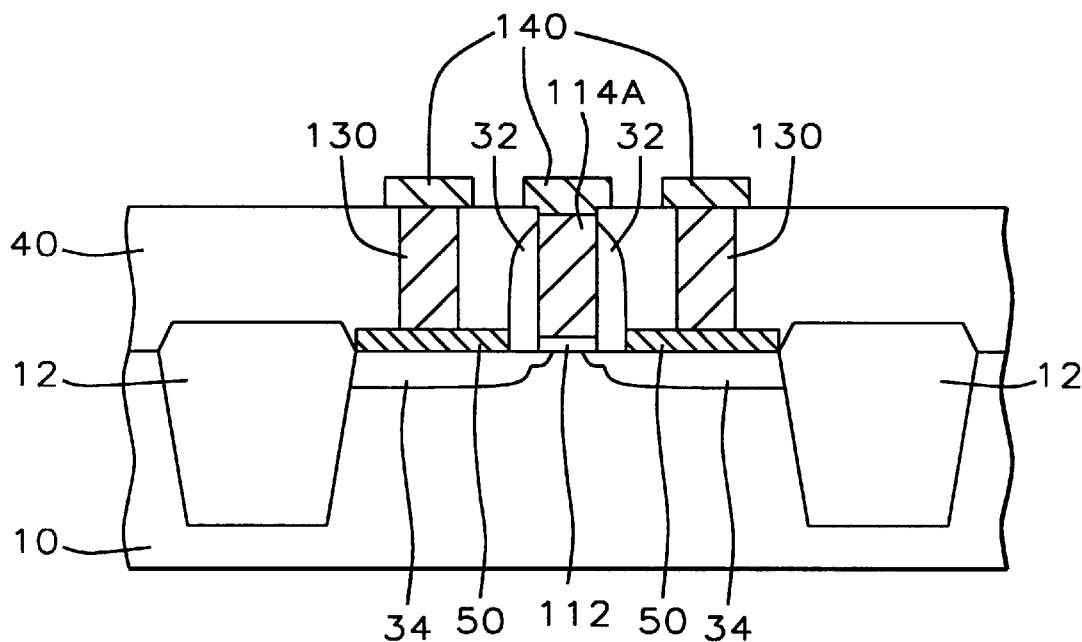

Referring to FIG. 13, contacts (130) are formed at the source and drain regions (34) by patterning the blanket dielectric layer (40) to form contact openings (125) and filling the contact openings (125) with conductive plugs (130). The conductive plugs (130) are preferably composed of tungsten. A first metal layer (140) is formed over the blanket dielectric layer (40) and the conductive plugs (130) and patterned to form device interconnections.

Second Embodiment—FIGS. 14–17

Figure 14:
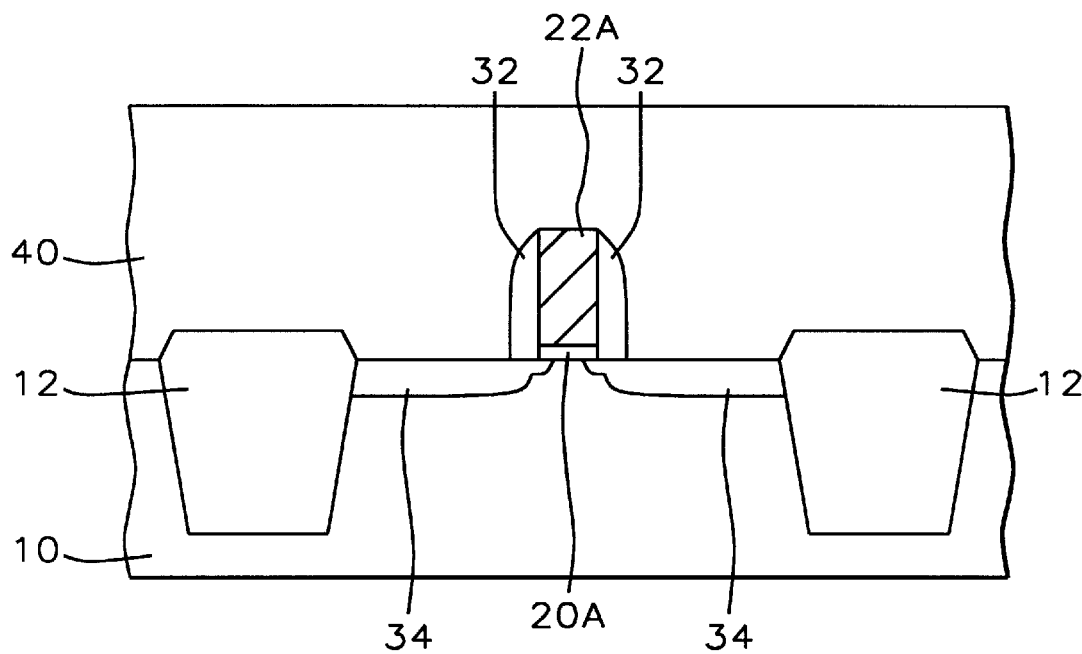
FIGS. 14 through 16 illustrate sequential sectional views of an alternate process for forming a metal gate using a replacement gate process with a silicon nitride dummy gate according to the invention.

Alternatively, the dummy gate can be composed of silicon nitride without a selectively deposited tungsten layer. Referring to FIG. 14, a dummy gate (25) is formed as before, except that the dummy gate electrode (22A) is composed of silicon nitride which can be formed using a chemical vapor deposition. A blanket dielectric (40) layer is formed over the dummy gate (25) as in the first embodiment.

Figure 15:
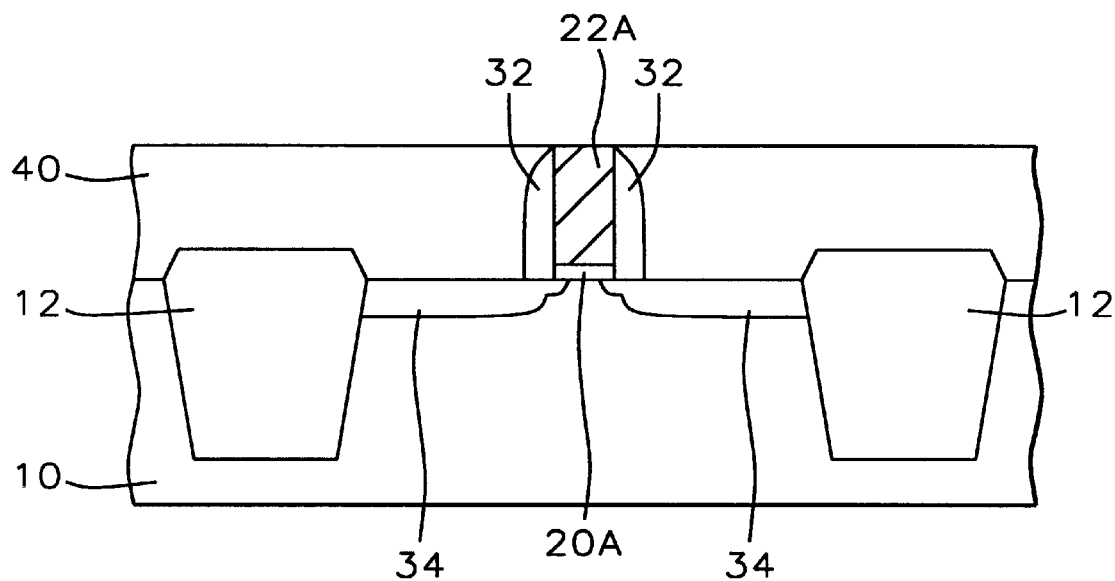

Referring to FIG. 15, the dummy gate (25) and blanket dielectric layer (40) are planarized using chemical mechanical polishing. The dummy gate electrode (22A) is removed using a wet chemical etch. The dummy gate oxide (20A) can then be removed in-situ using a $CHF_3/CF_4$ etch chemistry, thereby exposing the substrate structure (10) in the gate opening (105).

Figure 16:
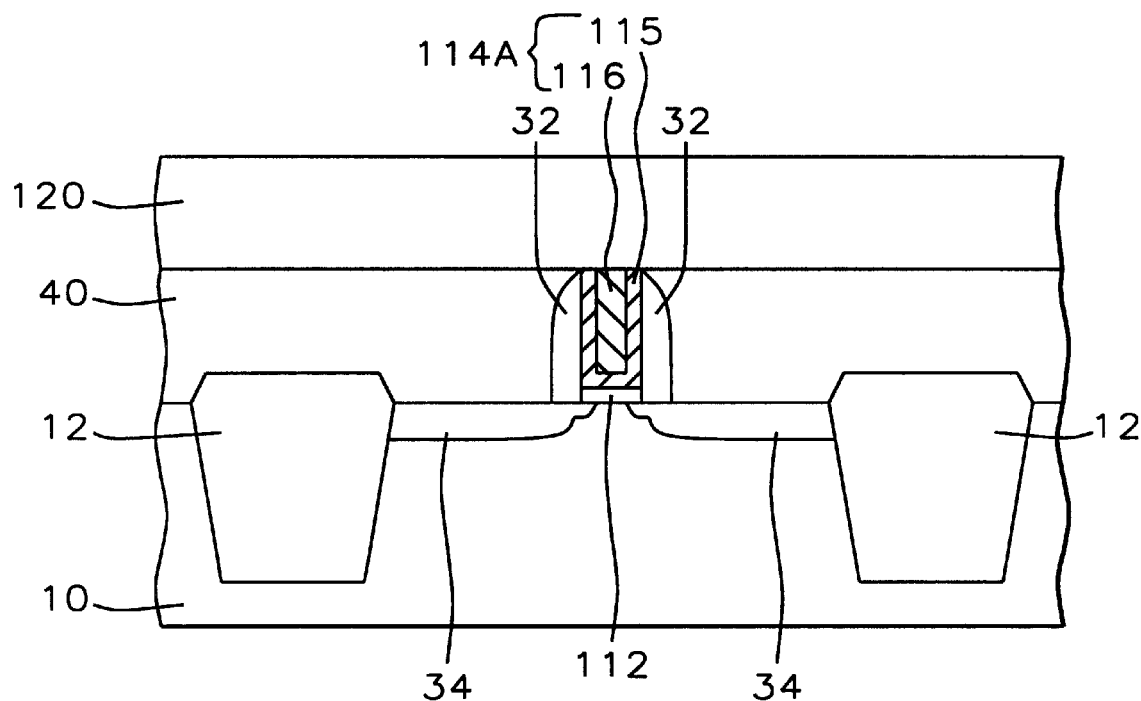

Referring to FIG. 16, a gate oxide (112) and gate electrode (114A) are formed as in the first embodiment. The gate electrode preferably comprises a titanium nitride barrier layer (115) having a thickness of between about 50 Angstroms and 500 Angstroms and a tungsten layer (116) having a thickness of between about 50 Angstroms and 2000 Angstroms overlying said barrier layer. The titanium nitride barrier layer (115) and the tungsten layer (116) are preferably formed using chemical vapor deposition.

Figure 17:
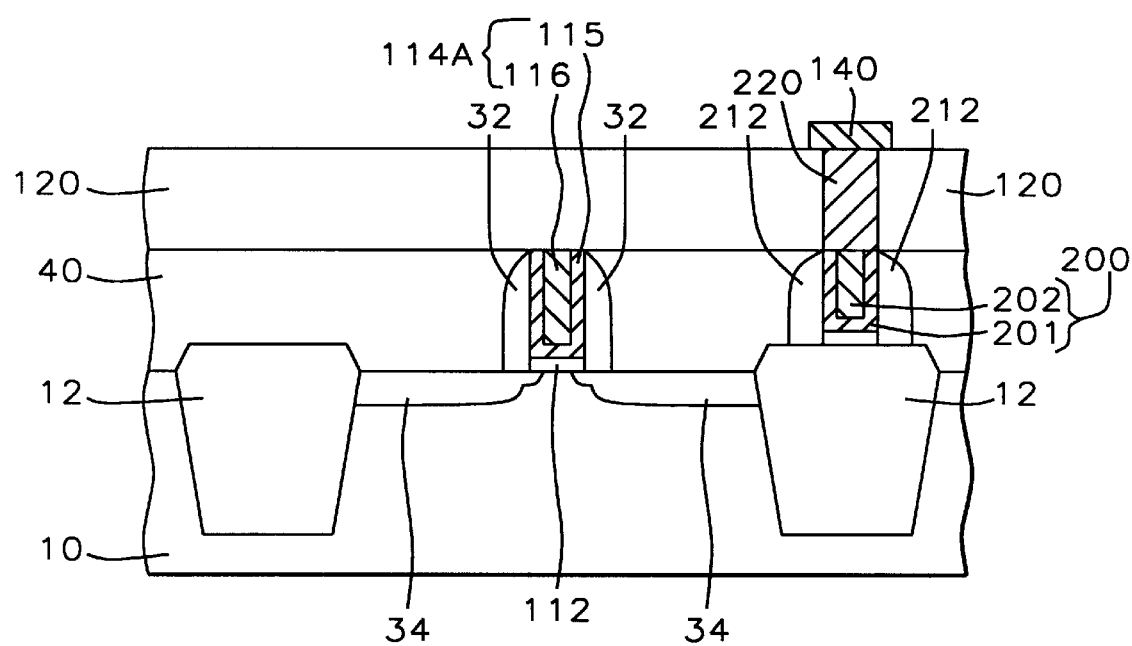
FIG. 17 illustrates a device formed according to the alternate process using a replacement gate process with a silicon nitride dummy gate in which a contact is formed through the interlevel dielectric layer and the blanket dielectric layer to a word line overlying the isolation structure.

FIG. 17 illustrates a device formed according to the alternate process using a replacement gate process with a silicon nitride dummy gate (25) and a silicon nitride dummy word line (not shown). A dummy word line (200) and word line spacers (212) are formed overlying the isolation structure (12) simultaneous with the formation of the dummy gate (25) and spacers (32). The dummy word line is removed with the dummy gate (25). A word line (200) is formed simultaneously with the gate electrode (114A), comprising the same materials as the gate electrode (114A). The dummy word line is removed with the dummy gate (25). An interlevel dielectric layer (210) is formed over the gate electrode (114A), the word line (200) and the blanket dielectric layer (40). A contact (220) is formed through the interlevel dielectric layer (210) and the blanket dielectric layer (40) to the word line (200). A first metal layer (140) can then be formed over the interlevel dielectric layer (40) and the contact (220) to provide device interconnections.

While the invention has been particularly shown and described with reference to the preferred embodiments thereof, it will be understood by those skilled in the art that various changes in form and details may be made without departing from the spirit and scope of the invention.

What is claimed is:

1. A method for forming a metal gate using a replacement gate process with a selective tungsten deposition comprising the steps of:

a. forming a dummy gate oxide layer on a substrate structure;

b. forming a dummy gate electrode layer on said dummy gate oxide layer; said dummy gate electrode layer being composed of polysilicon;

c. patterning said dummy gate electrode layer and said dummy gate oxide layer to form a dummy gate having sidewalls;

d. implanting impurity ions into said substrate structure using said dummy gate as an implant mask;

e. forming spacers on said sidewalls of said dummy gate; said spacers being composed of silicon dioxide or silicon oxynitride;

f. implanting impurity ions into said substrate structure using said dummy gate and said spacers as an implant mask and performing a rapid thermal anneal to form source and drain regions;

g. forming a selective tungsten layer on said dummy gate electrode and on said source and drain regions;

h. forming a blanket dielectric layer over said dummy gate and said substrate structure;

i. planarizing said blanket dielectric layer using a chemical mechanical polishing process and stopping on said tungsten layer;

j. removing said tungsten layer overlying said dummy gate and said dummy gate; thereby forming a gate opening;

k. forming a gate oxide layer on said substrate structure in said gate opening;

l. forming a gate electrode layer over said gate oxide layer; said gate electrode layer being composed of a metal selected from the group comprising titanium, tungsten, or aluminum; and m. planarizing said gate electrode layer stopping on said blanket dielectric layer thereby forming a metal gate.

2. The method of claim 1 wherein said gate electrode is composed of a layer of tungsten over a layer of titanium nitride.

3. The method of claim 1 wherein said gate electrode is composed of a layer of aluminum over a layer of titanium nitride.

4. The method of claim 2 wherein said layer of titanium nitride has a thickness of between about 50 Angstroms and 500 Angstroms.

5. The method of claim 3 wherein said layer of titanium nitride has a thickness of between about 50 Angstroms and 500 Angstroms.

6. The method of claim 1 wherein said tungsten layer overlying said dummy gate and said dummy gate electrode are removed using a selective etch having a chlorine containing chemistry.

7. The method of claim 1 wherein said tungsten layer is formed by selective chemical vapor deposition at a temperature of between about 300° C. and 500° C. and a pressure of between about 50 mTorr and 500 mTorr using a chemistry of $SiH_4$ and $WF_6$.

8. The method of claim 7 wherein said tungsten layer is formed using a flow rate ratio of $SiH_4$ to $WF_6$ of between about 0.1 and 5.

9. A method for forming a metal gate using a replacement gate process with a selective tungsten deposition comprising the steps of:

a. providing a substrate structure having isolation structures thereon;

b. forming a dummy gate oxide layer on said substrate structure;

c. forming a dummy gate electrode layer on said dummy gate oxide layer; said dummy gate electrode layer being composed of polysilicon;

d. patterning said dummy gate electrode layer and said dummy gate oxide layer to form a dummy gate comprising a dummy gate oxide and a dummy gate electrode and having sidewalls;

e. implanting As ions for lightly doped source and drain regions or highly doped source and drain extensions into said substrate structure at an energy of between about 1 KeV and 100 KeV and at a dose of between about 1E12 atm/cm$^2$ and 5E15 atm/cm$^2$ using said dummy gate as an implant mask;

f. forming spacers on said sidewalls of said dummy gate; said spacers being composed of silicon dioxide or silicin oxynitride;

g. implanting As ions into said substrate stricture at an energy of between about 10 KeV and 100 KeV and at a dose of between about 1E15 atm/cm$^2$ and 8E15 atm/cm$^2$ using said dummy gate and said spacers as an implant mask and performing a rapid thermal anneal to form source and drain regions;

h. forming a selective tungsten layer on said dummy gate electrode and on said source and drain regions;

i. forming a blanket dielectric layer over said dummy gate and said substrate structure;

j. planarizing said blanket dielectric layer using a chemical mechanical polishing process using said tungsten layer for a chemical mechanical polishing stop layer;

k. removing said tungsten layer overlying said dummy gate and said dummy gate electrode using a selective etch; thereby forming a gate opening;

l. removing said dummy gate oxide in said gate opening;

m. forming a gate oxide layer on said substrate structure in said gate opening;

n. forming a gate electrode layer over said gate oxide layer; said gate electrode layer being composed of a metal selected from the group composed of titanium, tungsten, and aluminum;

o. planarizing said gate electrode layer stopping on said blanket dielectric layer thereby forming a gate electrode;

p. forming contacts at said source and drain regions by patterning said blanket dielectric layer to form contact openings and filling, said contact openings with conductive plugs; and q. forming a first metal layer over said inter level dielectric and said conductive plugs.

10. The method of claim 9 wherein said gate electrode is composed of a layer of tungsten over a layer of titanium nitride.

11. The method of claim 9 wherein said gate electrode is composed of a layer of aluminum over a layer of titanium nitride.

12. The method of claim 10 wherein said layer of titanium nitride has a thickness of between about 50 Angstroms and 500 Angstroms.

13. The method of claim 11 wherein said layer of titanium nitride has a thickness of between about 50 Angstroms and 500 Angstroms.

14. The method of claim 9 wherein said tungsten layer overlying said dummy gate and said dummy gate electrode are removed using a selective etch having a chlorine containing chemistry.

15. The method of claim 9 wherein said tungsten layer is formed by selective chemical vapor deposition at a temperature of between about 300° C. and 500° C. and a pressure of between about 50 mTorr and 500 mTorr using a chemistry of SiH$_4$ and WF$_6$.

16. The method of claim 15 wherein said tungsten layer is formed using a flow rate ratio of SiH$_4$ to WF$_6$ of between about 0.1 and 5.

17. A method for forming a metal gate using a replacement gate process, comprising the steps of:

a. providing a substrate structure having isolation structures thereon;

b. forming a dummy gate oxide layer on said substrate structure;

c. forming a dummy gate electrode layer on said dummy gate oxide layer; said dummy gate electrode layer being composed of silicon nitride;

d. patterning said dummy gate electrode layer and said dummy gate oxide layer to form a dummy gate comprising a dummy gate oxide and a dummy gate electrode and having sidewalls;

e. implanting impurity ions into said substrate structure using said dummy gate as an implant mask;

f. forming spacers on said sidewalls of said dummy gate; said spacers being composed of silicon dioxide or silicin oxynitride;

g. implanting impurity ions into said substrate structure using said dummy gate and said spacers as an implant mask and performing a rapid thermal anneal to form source and drain regions;

h. forming a blanket dielectric layer over said dummy gate and said substrate structure;

i. planarizing said blanket dielectric layer using a chemical mechanical polishing process;

j. removing said dummy gate electrode using a wet etch; thereby forming a gate opening;

k. removing said dummy gate oxide in said gate opening;

l. forming a gate oxide layer on said substrate structure in said gate opening;

m. forming a gate electrode layer over said gate oxide layer; said gate electrode layer being composed of a metal selected from the group composed of titanium, tungsten, and aluminum;

n. planarizing said gate electrode layer stopping on said blanket dielectric layer thereby forming a gate electrode; and o. forming an inter level dielectric layer over said gate electrode and said blanket dielectric layer.

18. The method of claim 17 wherein said gate electrode layer comprises a titanium nitride barrier layer having a thickness of between about 50 Angstroms and 500 Angstroms and a tungsten layer having a thickness of between about 50 Angstroms and 2000 Angstroms overlying said barrier layer.

* * * * *